United States Patent [19]

Nelson et al.

[11] 4,046,605

[45] Sept. 6, 1977

[54] METHOD OF ELECTRICALLY ISOLATING INDIVIDUAL SEMICONDUCTOR CIRCUITS IN A WAFER

[75] Inventors: Carl T. Nelson, Sunnyvale; Brian E. Hollins, Los Altos, both of Calif.

[73] Assignee: National Semiconductor Corporation, Santa Clara, Calif.

[21] Appl. No.: 600,814

[22] Filed: July 31, 1975

Related U.S. Application Data

[63] Continuation-in-part of Ser. No. 432,853, Jan. 14, 1974, abandoned.

[51] Int. Cl.² .................. H01L 21/20; H01L 21/66; H01L 21/78
[52] U.S. Cl. .................. 148/175; 29/574; 29/576 R; 29/577; 29/580; 29/583; 148/187; 148/191; 357/34; 357/40; 357/48; 357/55; 357/56
[58] Field of Search ............. 148/1.5, 175, 187, 191; 357/48, 55, 56, 34, 40; 29/574, 580, 583, 576, 577

[56] References Cited

U.S. PATENT DOCUMENTS

| 3,299,329 | 1/1967 | Pollock | 357/48 X |
|---|---|---|---|
| 3,394,037 | 7/1968 | Robinson | 357/55 X |
| 3,450,963 | 6/1969 | Tsai | 357/48 X |
| 3,460,006 | 8/1969 | Strull | 148/175 X |
| 3,481,801 | 12/1969 | Hugle | 148/175 |
| 3,581,165 | 5/1971 | Seelbach et al. | 357/48 |
| 3,656,028 | 4/1972 | Langdon | 148/175 X |
| 3,664,894 | 5/1972 | Einthoven et al. | 148/187 X |
| 3,666,573 | 5/1972 | Brackelmanns | 148/175 |
| 3,769,105 | 10/1973 | Chen et al. | 148/175 |
| T892,019 | 11/1971 | Sack | 357/49 |

Primary Examiner—L. Dewayne Rutledge
Assistant Examiner—W. G. Saba
Attorney, Agent, or Firm—Gail W. Woodward; Willis E. Higgins

[57] ABSTRACT

A monolithic integrated circuit includes a vertical transistor having a low collector resistance with high current handling ability. The integrated circuit comprises a P type epitaxial layer grown on an N type substrate with both deep and shallow N type diffusions made into the P type layer. In the high current vertical transistor region with the deep N type diffusion, the deep diffusion penetrates the P layer to the N type substrate, whereas in the other transistor the shallow diffusion does not penetrate to the substrate. An N epitaxial layer is grown on the P type layer and thereafter normal processing techniques are used to form the base and emitter regions for the devices including the high current transistor which has its collector electrically coupled to the substrate.

9 Claims, 5 Drawing Figures

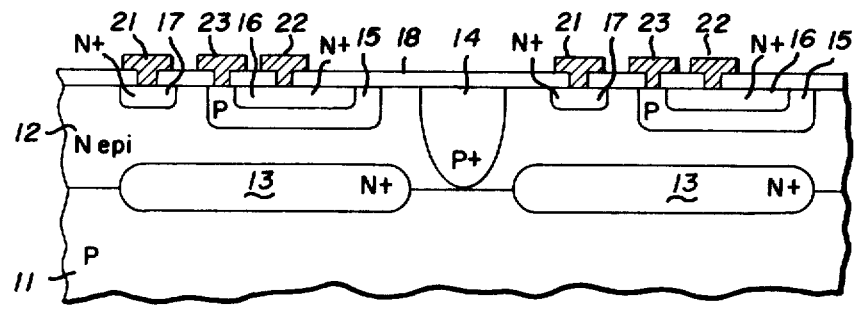
Fig_1 PRIOR ART
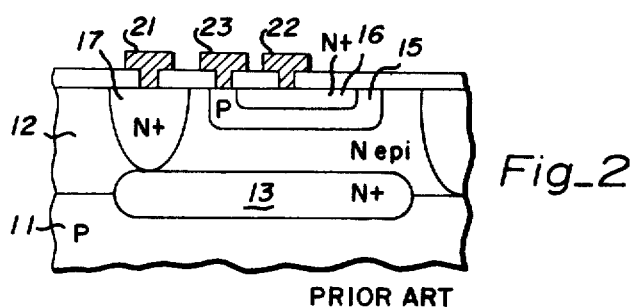
Fig_2 PRIOR ART
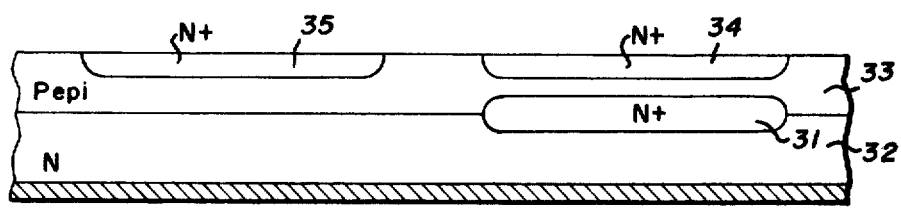
Fig_3
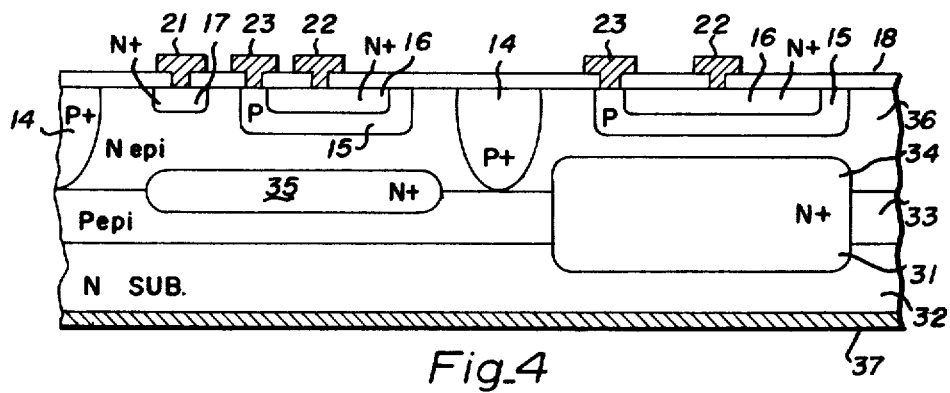
Fig_4

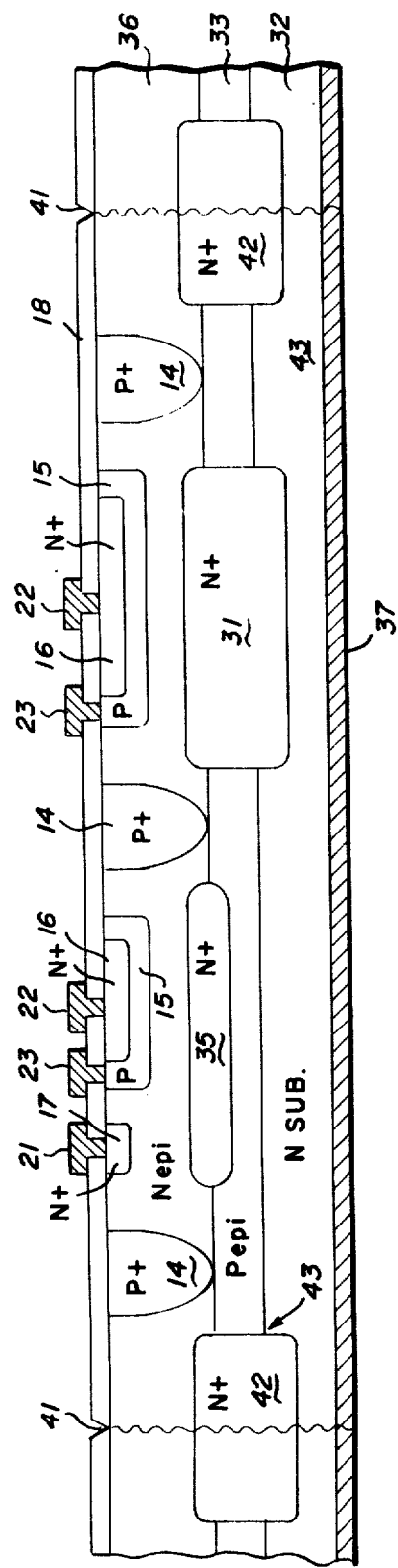
Fig_5

METHOD OF ELECTRICALLY ISOLATING INDIVIDUAL SEMICONDUCTOR CIRCUITS IN A WAFER

RELATED CASES

The present invention is a continuation-in-part invention of copending parent application U.S. Ser. No. 432,853 filed Jan. 14, 1974 now abandoned and assigned to the same assignee as the present invention.

BACKGROUND OF THE INVENTION

Transistors in monolithic semiconductor devices have relatively high collector resistances, and are thus not well suited for high power devices, e.g. greater than 1 amp devices. Such known transistors comprise, for example, a P base diffusion in an N type epitaxial layer, the N epitaxial layer being grown on a P type substrate. An N+ buried layer is formed by diffusion into the P substrate before the growth of the N type epitaxial layer and below the base region. An N+ emitter diffusion is formed in the P base diffusion region and a collector connection region is formed by an N+ diffusion in the N type epitaxial layer laterally displaced from the P type base diffusion region.

The collector resistance for such a transistor is formed by the path between the lower edge of the P base region and the upper edge of the N+ buried layer, plus the lateral path from under the base region to under the N+ collector connection region mainly via the N+ buried layer region, plus the vertical path from the N+ buried layer up to the collector connection region. For large well designed geometries the lateral path accounts for about half of the total collector resistance and the vertical path beneath the collector connection diffusion region accounts for about forty percent of the total.

One known technique for decreasing the total collector resistance is to diffuse deeply the N+ collector connection region such that it extends down through the N epitaxial layer and into contact with the N+ buried layer region. Since the path between N+ buried layer and the collector contact region accounted for about forty percent of the total collector resistance, a substantial reduction in collector resistance is accomplished. However, the lateral path from under the base region over to the deep diffused collector contact region still remains and accounts for a large part of the total resistance.

In a discrete transistor, no such lateral path exists and the collector resistance is low. The emitter, base, and collector regions are arranged in vertical alignment, with the N epitaxial region, in which the base diffusion is made, being grown on an N+ substrate, and the under surface of the substrate is utilized as the collector connection surface. The principal resistance is formed only between the P base and the lower edge of the N epitaxial layer, and thus the collector resistance is low and such a discrete transistor has good current handling characteristics.

BRIEF SUMMARY OF THE INVENTION

The present invention provides a transistor on a monolithic integrated circuit, the transistor having a low collector resistance and thus being suitable for operation at high currents with low saturation voltage. The high current handling transistor is formed vertically in the semiconductor with a collector connection at the bottom surface of the substrate; the other transistor devices on the wafer are formed laterally with their collector contacts on the upper surface. These transistor devices are electrically isolated from the high current handling device.

In a typical NPN form of device made in accordance with the present invention, the starting substrate is N material into which an N+ layer region is diffused at the area where the high current handling transistor is to be formed. A P layer is then epitaxially grown on the N substrate and a second N+ layer region is thereafter diffused into the upper surface of the P epitaxial layer in the area above the first N+ layer region, thus forming two buried N+ layers in this area. N+ buried layer regions are also formed in the upper surface of the P epitaxial layer at each area where an isolated lateral transistor is to be formed on the wafer.

An N epitaxial layer is then grown on top of the P epitaxial layer and isolation diffusion regions are formed separating the various devices. This is followed by the P base diffusion for all the transistors, including the high current transistor and the subsequent N+ emitter diffusions for each transistor, as well as the N+ upper surface collector connection diffusions for the isolated lateral transistors.

During high temperature steps in the processing of the monolithic device, both of the N+ diffusion regions in the high current transistor area spread vertically toward each other until they overlap and form a thick or deeply diffused N+ buried layer extending from a region spaced below the P base down into the N+ substrate. The collector connection for this transistor is made to the N substrate, and thus the collector resistance, formed by the narrow N type epitaxial region between the bottom of the P base and the top of the deep diffused N+ buried layer, is relatively low.

The P type epitaxial layer forms the substrate region for the remaining transistors which are standard type devices with laterally connected collectors. Only one vertical current carrying transistor is formed on a chip, except that more than one may be formed if they all share a common collector at the N substrate.

An N type frame region is formed by up and down diffusion through the P epi layer in vertical registration with the boundary of each integrated circuit chip.

When the chips are cleaved from the wafer the PN junction between the P epi layer and the N substrate layer is buried so as to avoid undesired leakage current across the PN junction.

BRIEF DESCRIPTION OF THE DRAWINGS

FIG. 1 is a cross section view of a portion of a monolithic integrated circuit structure showing two isolated lateral transistors formed herein in accordance with the prior art, FIG. 2 is a cross-section view of a device similar to FIG. 1 showing a known technique for reducing the collector resistance of the transistor, FIG. 3 is a cross-section view of a portion of the novel monolithic device of the present invention in one stage of its fabrication, FIG. 4 is a cross-section view of the novel monolithic device of FIG. 3 showing the completed vertical current carrying transistor and one of the lateral transistors, and FIG. 5 is a view similar to that of FIG. 4 depicting an alternative embodiment of the present invention.

DESCRIPTION OF THE PREFERRED EMBODIMENTS

Referring now to FIG. 1 there is shown two lateral type transistors formed in a well known manner on a monolithic structure comprising a lightly doped P type substrate 11 (with a bulk resistance of about 1–10Ω cm) having an N type epitaxial layer 12 (about 1–5Ω cm) grown thereon, N+ buried layers 13 (with a sheet resistance of about 20Ω/□) being diffused into the P substrate prior to the growth of the N epitaxial layer. The various transistor areas are then delineated by the standard deep P+ isolation diffusions 14. The P base diffusion regions 15 are then formed followed by the N+ emitter diffusion areas 16 and the N+ collector diffusion surface contact regions 17. The oxide surface layer 18 is then provided with openings for the various metal connects including the collector connects 21, the emitter connects 22, and the base connects 23.

Such transistors are not well suited for high current use, for example a current of greater than 1 amp, since the collector resistance values are too high for devices of reasonable size. The collector resistance is formed by the material in the path from the under surface of the P base region 15 to the upper surface of the N+ buried layer 13, plus the lateral path from under the P base 15 to under the N+ collector connect region 17, mainly via the N+ buried layer 13, plus the path from the upper surface of the N+ buried layer 13 up to the N+ connect region 17. Of the total resistance, about 40% is contributed by the path between the N+ collector connection region 17 and N+ buried layer 13, while about 50% is contributed by the lateral path through the N epitaxial layer from under the base region 15 to under the collector connection region 17. These approximate figures apply for most well designed large geometries.

One known technique for lowering the collector resistance is by eliminating the vertical path through the N epitaxial layer 12 between the collector connection region 17 and the N+ buried layer 13. This is accomplished by forming the collector connection region 17 with a deep N+ diffusion plug (see FIG. 2) prior to the formation of the base regions 15 and emitters 16. This deep diffusion drives the collector connection region or plug 17 down through the N epitaxial layer 12 and into overlapping connection with the N+ buried layer 13. This provides about a factor of two improvement in the collector current capability of the transistor. However, this falls short of the desired lower collector resistance since the lateral path from under the base 15 and over to the collector connection region mainly via the buried N+ layer 13 still exists, and this path provides the greatest increment of collector resistance.

Referring now to FIG. 3, the initial stage in the formation of a low collector resistance transistor of the present invention comprises the diffusion of a first N+ layer 31 in the N type semiconductor substrate body 32 (with a bulk resistivity of about 0.1 ohm cm) in the region in which the high current handling transistor is to be located. This is followed by the epitaxial growth of a P layer 33 (about 1Ω cm) on top of the N substrate 32. A second N+ layer 34 is diffused into the P epi layer 33 directly over the region of the first buried layer 31, and similar N+ layers such as 35 are diffused into the P epi layer 33 at the locations of the other transistors, which are to be formed as isolated transistors, on the substrate.

Referring now to FIG. 4, an N epitaxial layer 36 (about 1 ohm cm) is then grown on top of the P epi layer 33 and then the P+ isolation regions 14 are diffused into this N epi layer 36. The P base diffusions 15 are then made, followed by the N+ emitter diffusions 16 and the N+ collector connection regions 17 for the isolated transistors.

During the high temperature stages of fabrication, e.g., during the deep P+ diffusion of the isolation regions such as 14, the N+ buried layers 31 and 34 diffuse in a vertical direction until such time as the two buried layers overlap and form a single thick N+ buried layer as shown in FIG. 4. The collector connection for the transistor on the right hand side can now be made to the under surface of the N substrate 32, for example via metal connector 37, and the principal collector resistance is now formed only by the path between the lower surface of the base region 15 and the upper edge of the N+ buried layer region 34. The N+ buried layers 34, 31 and the N substrate 32 forms a very low resistance path therethrough.

The P epi layer 33 forms the device substrate for all the other transistors formed on the semiconductor wafer as illustrated by the left hand transistor in FIG. 4. Since this transistor has a high collector resistance, it does not have the current carrying capability of the vertical transistor on the right hand side of FIG. 4.

In the monolithic integrated circuit of FIG. 4, the vertical transistor has a relatively high current carrying capability, as of 2 to 10 amps, whereas the isolated lateral transistors of the integrated circuit have relatively high collector to emitter breakdown voltages, as of greater than 20 volts and preferably in the range of 25 to 30 volts. In such a device, as illustrated in FIG. 4, the N substrate region 32 has a thickness falling within the range of 5 to 20 mils depending upon the diameter of the wafer and a resistivity falling within the range of 0.08 to 0.24 ohm centimeters. If the resistivity of the N substrate 32 is below 0.08 ohm centimeters the PN junction between the P type epi layer 33 and the N substrate layer 32 will move up toward the N epi layer 36 during diffusion steps employed in the integrated circuit fabrication process. On the other hand, if the resistivity of the N substrate layer 32 is too high, i.e., higher than 0.24 ohm centimeters, the collector resistance of the vertical NPN transistor will be too high.

The P epi layer 33 preferably has a thickness falling within the range of 10 to 16 microns and a resistivity falling within the range of 0.7 to 2.0 ohm centimeters. If the resistivity of the P epi layer 33 is too low, i.e., less than 0.7 ohm centimeters, the up diffusion of N+ region 31 will be reduced to the point where the N+ regions 34 and 31 may not overlap, in which case the N+ through region will not be formed. On the other hand, if the resistivity of the P type epi layer 33 is too high, i.e., greater than 2.0 ohm centimeters, then a punch-through voltage breakdown can occur, i.e., less than 20 volts, between the isolated collector 35 of the lateral NPN transistor to the collector 32 of the vertical power transistor by virtue of the fact that the depletion regions associated with the P epi 33 and N substrate 32 junction and the P epi 33 and isolated collector 35 junction can spread towards each other to the point that they touch.

If the thickness of the P epi layer 33 is too narrow, i.e., less than approximately 10 microns, the punch-through voltage goes too low, i.e., less than 20 volts, resulting in a condition similar to the resistivity of the P epi layer 33 being too high. Conversely, if the thickness of the P epi layer 33 is too great, i.e., greater than about 16 microns the through diffusion region 31 and 34 which passes through the P epi layer 33 is too difficult to achieve.

The N epi layer 36 preferably has a thickness falling within the range of 10 to 16 microns and a resistivity falling within the range of 0.5 to 2.0 ohm centimeters. If the thickness of the N epi layer 36 is too narrow, i.e., less than 10 microns, the collector to emitter breakdown voltage is decreased below 20 volts in the isolated transistor (lateral NPN transistors) due to reach-through breakdown between the depletion region surrounding the P region 15 and the buried N+ layer 35. On the other hand, if the N epi layer 36 is too thick the lateral transistor regions cannot be separated from the vertical transistor and from other lateral devices via the dependent isolation frames or boundaries 14, due to the limited depth thereof. If the resistivity of the N epi layer is too low, i.e., less than 0.5 ohm centimeters, avalanche breakdown is obtained between the P region 15 and the N epi layer 36. If the resistivity of the N epi layer 36 is too high, reachthrough breakdown can occur between the P region 15 and the buried layer 35 in the same manner as previously described with regard to the condition wherein the N epi layer 36 is too thin. Another constraint caused by too high a resistivity for the N epi layer 36 is an increase in the collector resistance of the lateral transistor.

Since the collector path for the low resistance transistor includes the N substrate 32, only one such independent high current carrying transistor may be fabricated on the semiconductor body except that two or more such transistors may be formed provided they have a common collector connection.

Referring now to FIG. 5 there is shown an alternative embodiment of the present invention. In the embodiment of FIG. 5, the structure is identical to that previously described with regard to FIG. 4 with the exception that at the boundary of each integrated circuit chip, which is to be scribed and diced from a given wafer along scribe lines 41, a frame-shaped through diffusion 42 is obtained in the P epi layer 33 in the same manner, i.e., by up and down diffusion of buried N layers at the same time and in the same diffusion step as previously described with regard to FIG. 3 for layers 31 and 34 utilized to obtain the other through diffusion. These frame regions 42 are provided in the P epi layer 33 at 42 in vertical registration with and along each of the intersecting scribe lines 41. This through diffusion 42 along the scribe lines 41 serves to provide a buried junction at 43 between the P epi layer 33 and the N substrate layer 32. In the absence of the through diffusions 42, at the boundary, a surface PN junction is formed between the P epi layer 33 and the N substrate layer 34 which, due to surface contamination, causes leakage current to flow between the P epi layer 33 and the N substrate layer 32. This undesired leakage current would appear in the integrated circuit as leakage from the isolated P region to the collector 32 of the low resistance vertical NPN transistor. The buried junctions 43 avoid this undesired current. In addition, the buried junctions 43 serve to isolate the P epi regions of each integrated circuit chips one from the other in the wafer prior to dicing so that the individual integrated circuit chips may be probed (tested) prior to cleaving. Without the frame-shaped through diffusions 42 a cumulative leakage current across the wafer between regions 32 and 33 would be obtained which would prevent probing (testing) individual circuit chips prior to cleaving.

Standard and well known photoresist masking, epitaxial growing, and diffusion styles are utilized in the fabrication of these novel structures. Also, although the invention was described relative to NPN devices, it may also be employed in the creation of PNP devices.

What is claimed is:

1. In a method of electrically isolating individual semiconductor circuits in a wafer having a plurality of said semiconductor circuits formed therein, said wafer being of the type having first and second layers of a first conductivity type separated by an intervening third layer of a second conductivity type, said transistor circuits to be separated from each other and from the wafer into individual semiconductor chips by severing the wafer along intersecting boundary lines defining the boundaries of individual semiconductor circuit chips, the steps of:

forming a lateral isolation region of first conductivity type passing through the third layer and extending along the boundary line between individual semiconductor circuit chip portions so as to form a buried P-N junction between said lateral isolation region and the third layer between the third layer and each of the first and second layers along the individual chip boundary lines, whereby undesired leakage current between individual ones of the semiconductor circuits is prevented in the wafer to permit probe testing of the individual semiconductor chips prior to separating the individual circuit chips from the wafer.

2. The method of claim 1 wherein the step of forming the lateral isolation region comprises diffusing said lateral isolation region through the intervening third layer.

3. The method of claim 1 wherein the step of forming the lateral isolation region comprises diffusing the lateral isolation region through the intervening third layer from opposite sides of said intervening third layer toward the center of said third layer.

4. The method of claim 1 wherein the step of forming the lateral isolation region comprises forming the lateral isolation region below the surface of the semiconductive wafer.

5. The method of claim 1 wherein the step of forming the lateral isolation region comprises forming the lateral isolation region as a frame-like region circumscribing individual ones of the semiconductor circuit chip portions along the intersecting chip boundary lines.

6. The method of claim 2 wherein the step of forming the lateral isolation regions by diffusion includes diffusing the lateral isolation region through the intervening third layer as a frame-like region circumscribing individual ones of the semiconductor circuit chips along the intersecting chip boundary lines.

7. The method of claim 1 including probing the individual semiconductor circuits for testing thereof in the composite wafer before separation thereof into separate chips.

8. The method of claim 1 including the step of forming a vertical transistor structure as a portion of each of said semiconductor circuit portions with a collector region of said vertical transistor structure extending through the intervening third layer.

9. The method of claim 8 wherein the step of forming the semiconductor circuit portions includes forming a second transistor structure in each of said semiconductor chip portions by diffusing a base region of second conductivity type into said first layer of first conductivity type and subsequently forming an emitter region of second conductivity type in said base region and forming a collector contact of first conductivity type in said first layer, and diffusing a ring of second conductivity type through said first layer surrounding said second transistor circuit for isolating said vertical transistor structure from said second transistor structure.

* * * * *